(12) United States Patent
Li et al.

(10) Patent No.: US 10,994,878 B2
(45) Date of Patent: May 4, 2021

(54) FEEDING DEVICE FOR AN ELECTROSTATIC BAG

(71) Applicant: World Precision Manufacturing (Dongguan) Co., Ltd., Dongguan (CN)

(72) Inventors: Xin Li, Dongguan (CN); Jinsuo Sun, Dongguan (CN)

(73) Assignee: WORLD PRECISION MANUFACTURING (DONGGUAN) CO., LTD., Dongguan (CN)

( * ) Notice: Subject to any disclaimer, the term of this patent is extended or adjusted under 35 U.S.C. 154(b) by 204 days.

(21) Appl. No.: 16/142,761

(22) Filed: Sep. 26, 2018

(65) Prior Publication Data
US 2019/0023436 A1  Jan. 24, 2019

(30) Foreign Application Priority Data

Apr. 12, 2018  (CN) .......................... 201810327175.1

(51) Int. Cl.
| | |
|---|---|
| *B65B 43/42* | (2006.01) |
| *B65B 5/02* | (2006.01) |
| *B65B 25/00* | (2006.01) |
| *B65B 43/04* | (2006.01) |

(Continued)

(52) U.S. Cl.
CPC .............. *B65B 43/42* (2013.01); *B65B 5/022* (2013.01); *B65B 25/002* (2013.01); *B65B 43/04* (2013.01);
(Continued)

(58) Field of Classification Search
CPC ....... B65B 25/002; B65B 43/04; B65B 43/42; B65B 5/022; B65B 2210/02;
(Continued)

(56) References Cited

U.S. PATENT DOCUMENTS 2,668,677 A * 2/1954 Palmatier ............. B65H 16/021
242/559.2
3,466,840 A * 9/1969 Haddix .................. B65B 41/14
53/74

(Continued)

FOREIGN PATENT DOCUMENTS

| CN | 108341103 A | 7/2018 |
|---|---|---|
| CN | 108454915 A | 8/2018 |
| CN | 108499893 A | 9/2018 |

OTHER PUBLICATIONS

GEAR—Definition by Merriam-Webster Online Dictionary—Retrieved online from URL https://www.merriam-webster.com/dictionary/gear on Nov. 6, 2020 (Year: 2020).*

(Continued)

*Primary Examiner* — Valentin Neacsu
(74) *Attorney, Agent, or Firm* — Shimokaji IP

(57) ABSTRACT

A feeding device for an electrostatic bag, adapted for supplying electrostatic bags to a package mechanism so as to warp an SSD with an electrostatic bag, includes two carrying mechanisms arranged up and down, which respectively support at least one reel that is wound with multiple electrostatic bags. A feeding position is provided between the two carrying mechanisms and face the package mechanism. The two carrying mechanisms are movable up and down to switch positions with one another. The feeding device for an electrostatic bag can supply electrostatic bags to a package mechanism, reload the electrostatic bag without stopping the machine, and ensure the continuous operation of the package mechanism.

6 Claims, 8 Drawing Sheets

(51) Int. Cl.
  *H01L 21/67* (2006.01)
  *H01L 23/60* (2006.01)
  *B65B 43/12* (2006.01)
  *B65D 85/671* (2006.01)
  *B65H 16/02* (2006.01)
  *B65D 85/675* (2006.01)
  *B65B 43/50* (2006.01)
  *B65B 41/12* (2006.01)

(52) U.S. Cl.
  CPC ........ *H01L 21/67126* (2013.01); *H01L 23/60* (2013.01); *B65B 41/12* (2013.01); *B65B 43/12* (2013.01); *B65B 43/123* (2013.01); *B65B 43/50* (2013.01); *B65B 2210/02* (2013.01); *B65D 85/671* (2013.01); *B65D 85/675* (2013.01); *B65H 16/024* (2020.08)

(58) Field of Classification Search
  CPC ......... B65H 2301/413223; B65H 2301/41322; B65H 2301/41702; B65H 2301/418; B65H 2301/41818; B65H 2301/4181; B65H 2301/41812; B65H 2301/41816; B65H 16/005; B65H 16/021; B65H 16/023; B65H 16/024; B65H 16/02
  USPC ............. 53/570, 168, 389.4; 242/160.1, 559, 242/559.1, 559.2; 221/112, 113, 121; 414/331.01, 331.02, 331.04, 911
  See application file for complete search history.

(56) References Cited

U.S. PATENT DOCUMENTS

| | | | | |
|---|---|---|---|---|
| 3,546,850 | A * | 12/1970 | Itoda | G07D 9/065 53/389.2 |
| 4,162,025 | A * | 7/1979 | Achelpohl | B65B 43/123 221/72 |
| 4,614,075 | A * | 9/1986 | Focke | B65H 19/123 242/559.2 |
| 5,009,632 | A * | 4/1991 | Kruessel | B29C 65/78 493/189 |
| 5,024,042 | A * | 6/1991 | Meyer | B65B 39/007 53/168 |
| 5,274,984 | A * | 1/1994 | Fukuda | B65B 9/20 242/559.3 |
| 7,410,077 | B2 * | 8/2008 | Ness | B65D 85/671 206/389 |
| 10,773,845 | B2 * | 9/2020 | Michels | B65B 35/12 |
| 2007/0018023 | A1 * | 1/2007 | Ness | B65H 16/005 242/160.1 |
| 2015/0166206 | A1 * | 6/2015 | Kim | B65H 19/1868 242/418 |
| 2015/0274338 | A1 * | 10/2015 | Kawano | B43M 3/04 53/556 |
| 2017/0174372 | A1 * | 6/2017 | Quinones | B65B 65/006 |
| 2017/0334586 | A1 * | 11/2017 | Hansen | B65B 41/12 |
| 2018/0079537 | A1 * | 3/2018 | Lancaster, III | B65B 61/202 |
| 2018/0194498 | A1 * | 7/2018 | Michels | B65B 1/02 |
| 2019/0023502 | A1 | 1/2019 | Sun et al. | |
| 2019/0312550 | A1 | 10/2019 | Jung et al. | |

OTHER PUBLICATIONS

MECHANISM—Definition by Merriam-Webster Online Dictionary—Retrieved online from URL https://www.merriam-webster.com/dictionary/mechanism on Nov. 6, 2020 (Year: 2020).*

RACK—Definition by Merriam-Webster Online Dictionary—Retrieved online from URL https://www.merriam-webster.com/dictionary/rack on Nov. 6, 2020 (Year: 2020).*

* cited by examiner

FEEDING DEVICE FOR AN ELECTROSTATIC BAG

RELATED APPLICATIONS

This application claims the benefit of priority to Chinese Patent Application No. 201810327175.1 filed in Apr. 12, 2018, which is hereby incorporated by reference in its entirety.

FIELD OF THE INVENTION

The invention relates to a packaging device, and more particularly to a feeding device for an electrostatic bag for loading electrostatic bags.

BACKGROUND OF THE INVENTION

Solid state disks (SSDs) are smaller in size and faster to read, can be quickly accepted by users, and gradually replace mechanical hard disks. Compared to mechanical hard disks, SSDs are crash resistant, minor collisions do not result in data loss, and their service life is longer than that of mechanical hard disks. However, price of SSDs is significantly higher than that of mechanical hard disks. Once SSDs are damaged, data will be lost and cannot be retrieved. Therefore, it is necessary to properly package the SSDs.

An electrostatic bag covers the SSD to prevent static electricity from affecting the performance of the SSD. In order to automatically package the electrostatic bag outside the SSD, there is an urgent need for an automatic feeding device that can supply an electrostatic bag to the SSD.

SUMMARY OF THE INVENTION

One objective of the present invention is to provide a feeding device for an electrostatic bag for supplying electrostatic bags to a package mechanism, so as to automatically package the solid state disk inside of the electrostatic bag and avoid damaging the solid state disk due to the manual operation, thereby improving production efficiency.

To achieve the above objective, a feeding device for an electrostatic bag is provided, adapted for supplying electrostatic bags to a package mechanism so as to wrap an SSD with an electrostatic bag, which includes two carrying mechanisms arranged up and down, respectively for supporting at least one reel that is wound with multiple electrostatic bags. A feeding position is provided between the two carrying mechanisms and faces the package mechanism. The two carrying mechanisms are movable up and down to switch positions with one another.

In comparison with the prior art, the feeding device for an electrostatic bag can supply the electrostatic bag to the package mechanism so as to package the solid state disk inside an electrostatic bag. Two carrying mechanisms arranged up and down on the feeding device for an electrostatic bag can move up and down to switch positions. When the electrostatic bags of the carrying mechanism at the upper electrostatic bag supply position are used up, the two carrying mechanisms move up and down and switch positions. So another carrying mechanism is positioned at the upper electrostatic bag supply position, and the electrostatic bag is supplied to the package mechanism via a new reel. Therefore, the feeding device for an electrostatic bag can supply electrostatic bags to a package mechanism, reload the electrostatic bag without stopping the machine, and ensure the continuous operation of the package mechanism.

Preferably, a position switching mechanism is disposed between the two carrying mechanisms. When one of the carrying mechanisms is moved towards another of the carrying mechanisms, another of the carrying mechanisms is correspondingly moved under an action of the position switching mechanism to switch the two carrying mechanism positions with one another.

Concretely, the position switching mechanism includes gear racks.

Concretely, the feeding device for an electrostatic bag further includes a switching drive mechanism, for driving the two carrying mechanisms vertically.

Preferably, the feeding device for an electrostatic bag further includes a driving mechanism for driving at least one of the carrying mechanisms to move in a horizontal direction, so that when the two carrying mechanisms move up and down to switch positions, the two carrying mechanisms avoid collision.

Preferably, the driving mechanism is configured to drive one of the carrying mechanisms located on an upper side to move in a horizontal direction, so that projections of the two carrying mechanisms in a horizontal plane are staggered. Thereby, it can avoid interference when two carrying mechanisms move up and down to switch position.

Preferably, each carrying mechanism includes a positioning rod, for positioning the reel, and a tension rod disposed between the positioning rod and the package mechanism.

Preferably, each carrying mechanism further includes a drive member, for rotating the positioning rod to rotate the reel.

Preferably, the feeding device for an electrostatic bag further includes a feeding bracket disposed on the feeding position, for transporting the electrostatic bag to the package mechanism.

Preferably, the feeding bracket is provided with a clamping mechanism, for clamping and positioning the electrostatic bag.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
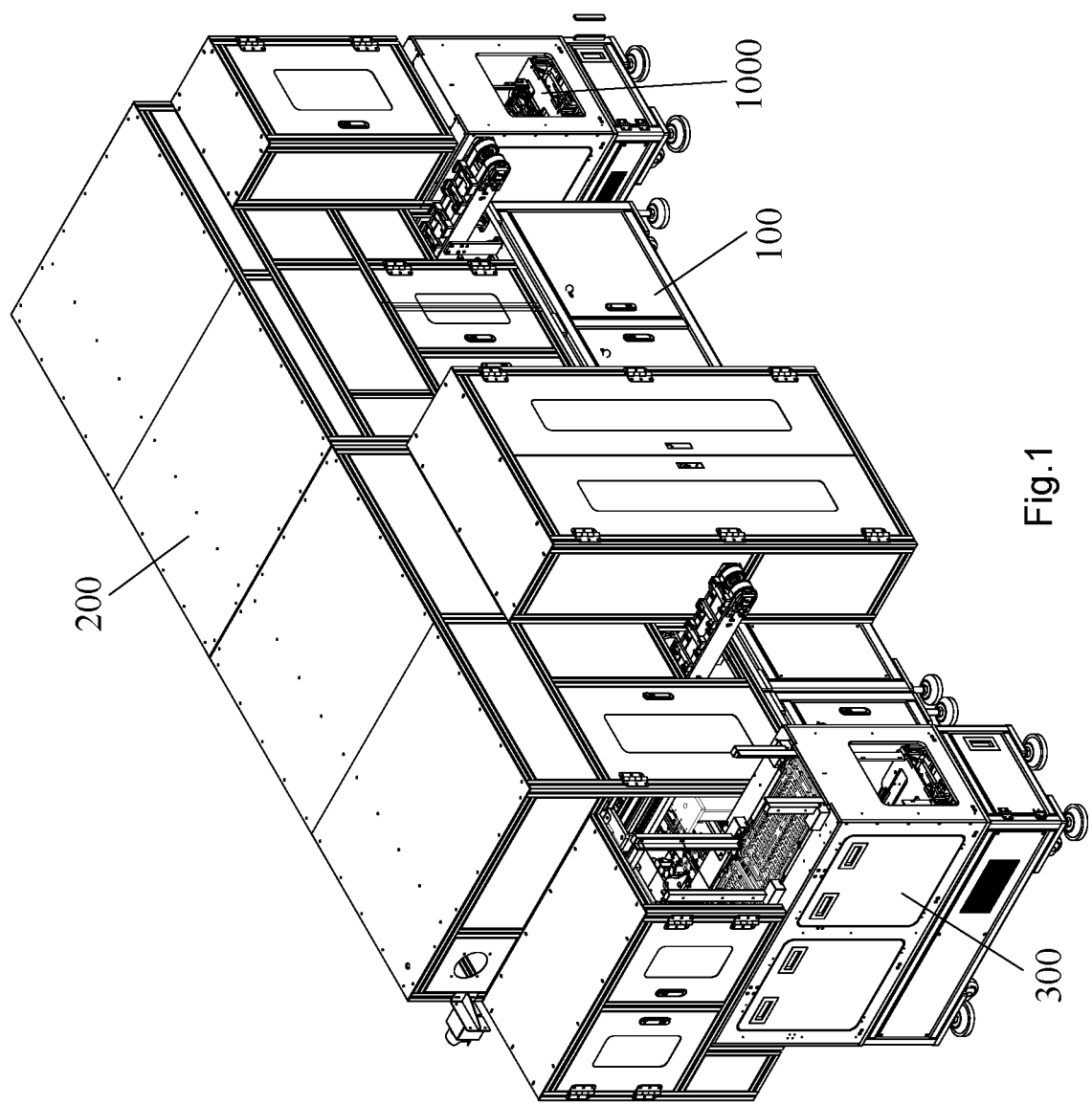
FIG. 1 is a perspective view of an electrostatic bag package production line of a solid state disk according to the present invention.

A distinct and full description of the technical solution of the present invention will follow in combination with the accompanying drawings.

Referring to FIGS. 1-4, the electrostatic bag package production line for solid state disk (SSD) is used to package an electrostatic bag S (not shown) on a solid state disk (not shown). Specifically, the position of the electrostatic bag is shown in FIG. 5. The electrostatic bag package production line for solid state disks includes a solid state disk feeding mechanism 400, a connecting finger device 500, a delivery device 600, and a solid state diskunloading mechanism 900. Besides, the electrostatic bag package production line for solid state disks further includes a sealing device for an electrostatic bag on one side of the delivery device 600. Concretely, the sealing device for an electrostatic bag includes a package mechanism 700 and a sealing mechanism 800 arranged in sequence along the conveying direction of the delivery device 600; and several detection mechanisms are also provided on the delivery device 600, to detect the solid state disk.

As shown in FIGS. 1-4, the electrostatic bag package production line for solid state disks includes a main frame 100, a solid state disk feeding mechanism 400 disposed above the main frame 100, a connecting finger device 500, a delivery device 600, a package mechanism 700, a sealing mechanism 800, and a solid state disk unloading mechanism 900. A tray feeding mechanism 300 is provided outside one end of the main frame 100 and at the beginning of the conveying direction of the delivery device 600. And, a tray unloading mechanism 1000 is provided outside the other end of the main frame 100 and at the end of the conveying direction of the delivery device 600. Specifically, a control component such as a motor, a control circuit, a PLC, and the like are disposed under the main frame 100. Meanwhile, the aforementioned multiple mechanisms and devices are respectively disposed above the main frame 100, and a housing 200 is also disposed outside the main frame 100. The housing 200 covers the aforementioned multiple mechanisms and devices provided above the main frame 100. Besides, the housing 200 is also provided with an operation panel, a monitor, and the like, to monitor and operate the electrostatic bag package production line for solid state hard disks.

Figure 2:
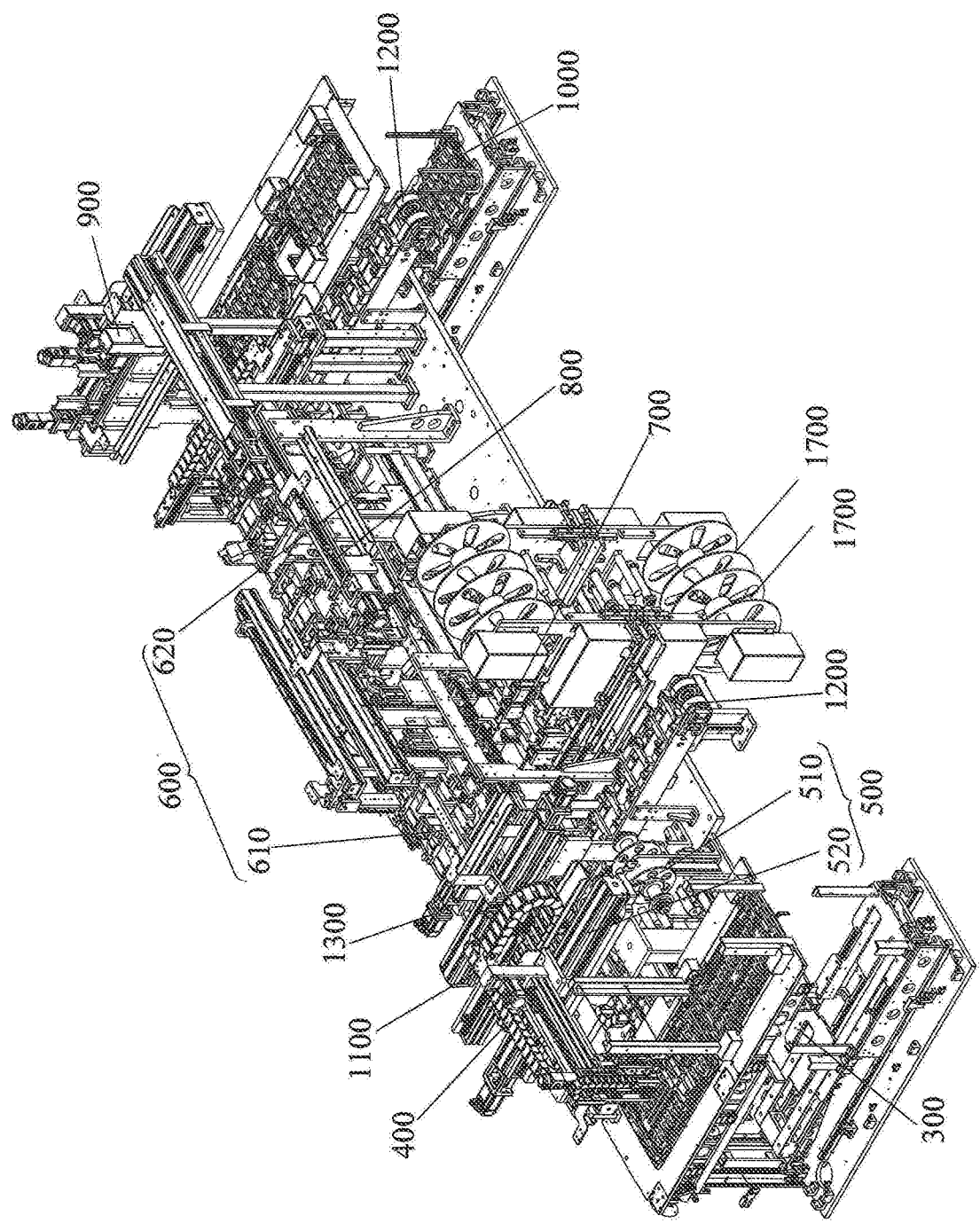
FIG. 2 is a perspective view of an internal structure of the electrostatic bag package production line of a solid state disk according to the present invention.
Figure 3:
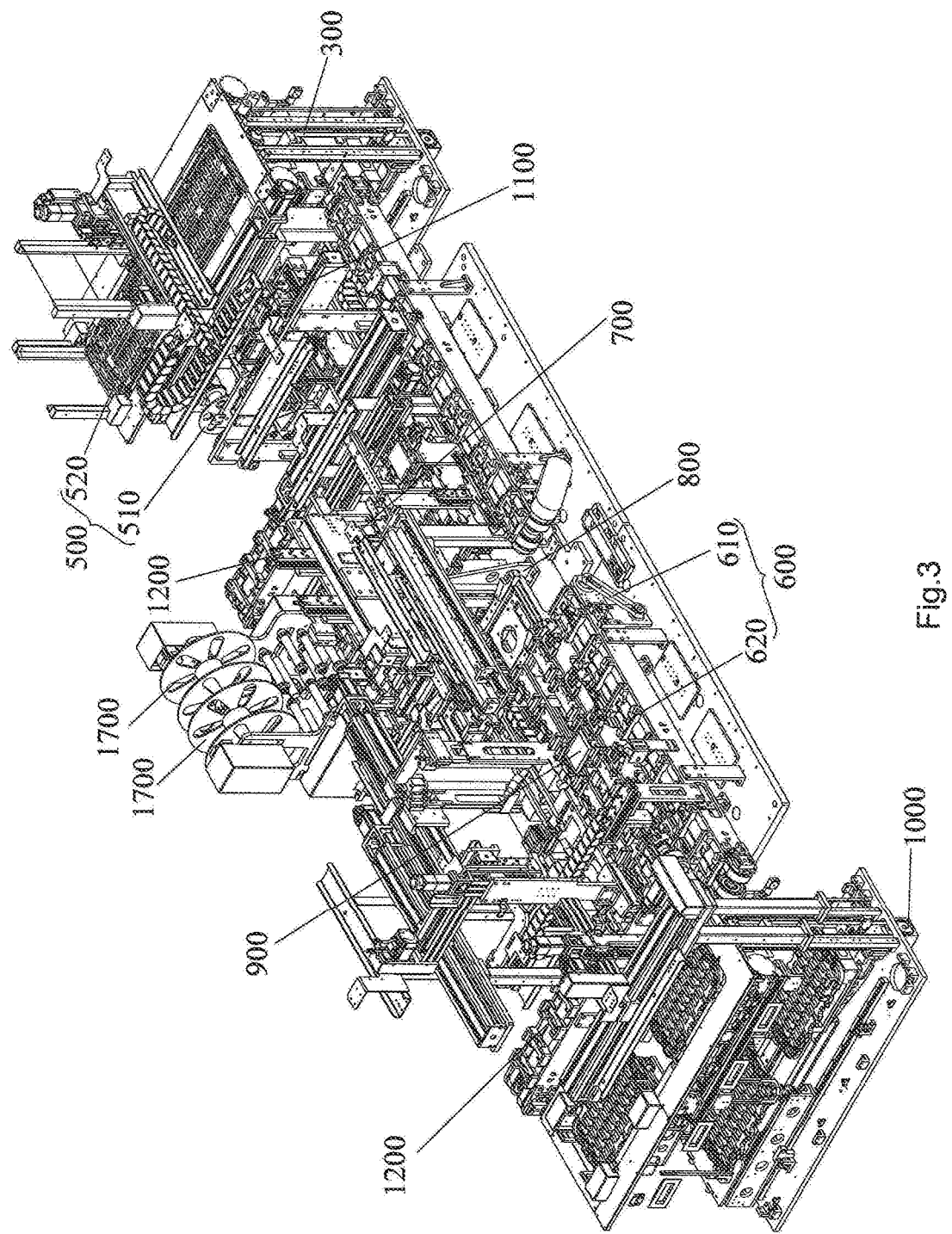
FIG. 3 is a perspective view of the internal structure of the electrostatic bag package production line of a solid state disk from another angle according to the present invention.
Figure 4:
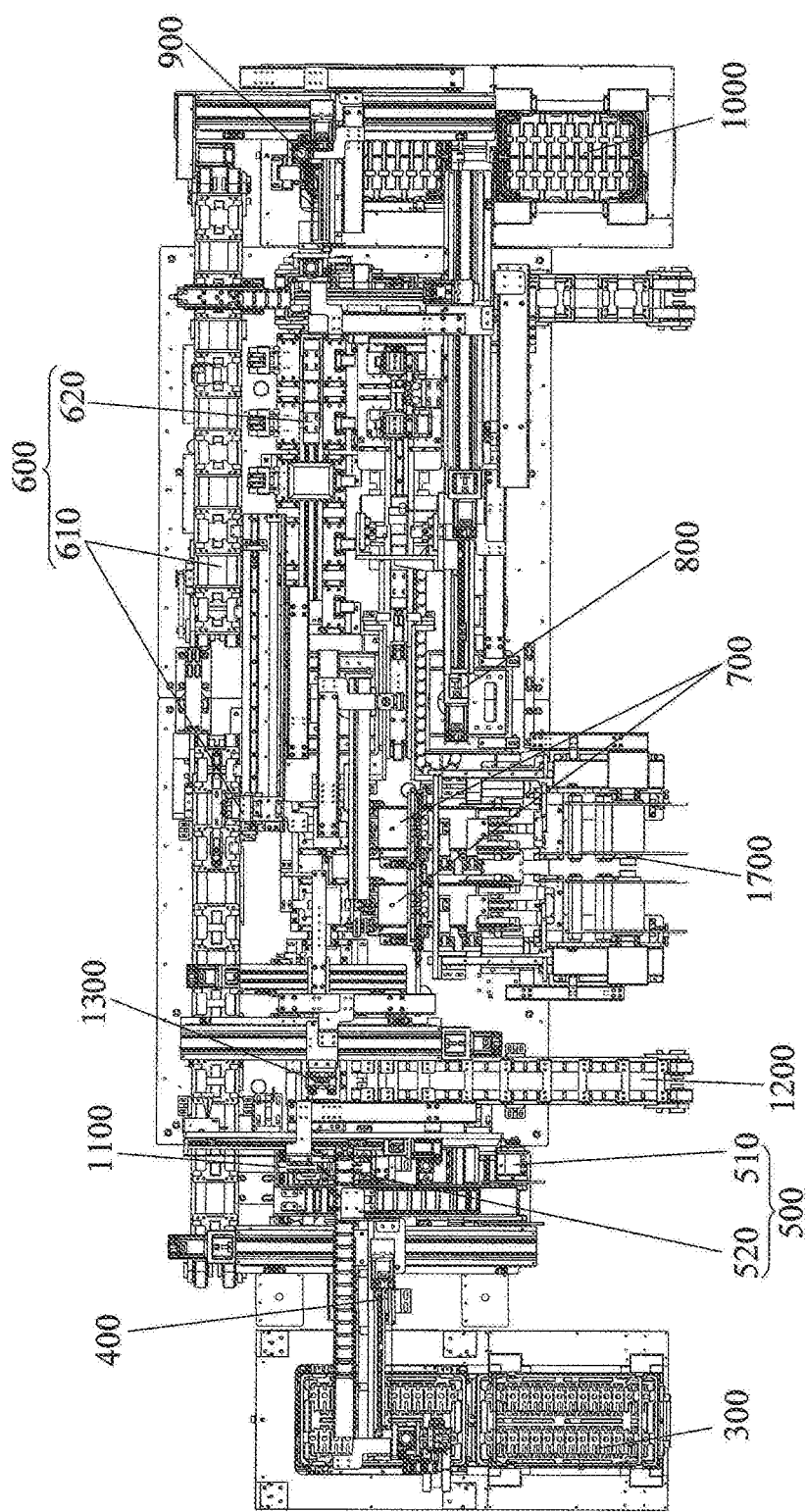
FIG. 4 is a top view of the internal structure of the electrostatic bag package production line of a solid state disk according to the present invention.
Figure 5:
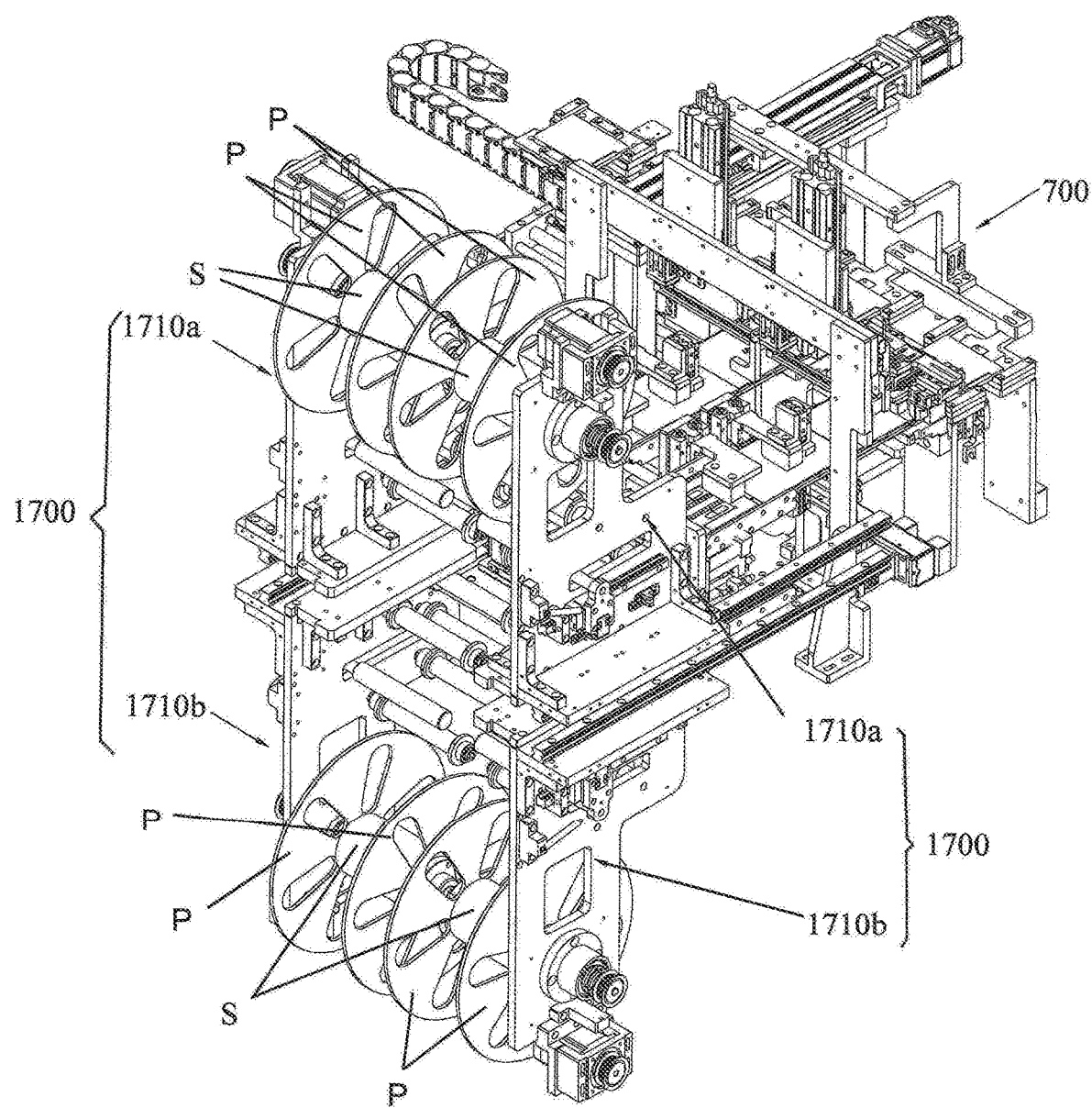
FIG. 5 is a perspective view of a combined structure of two feeding devices and a package mechanism according to the present invention.

As shown in FIG. 2 to FIG. 4, above the main frame 100, a first delivery device 610 and a second delivery device 620 are arranged in parallel along the length direction of the main frame 100. The first delivery device 610 and the second delivery device 620 move in the same direction, and transport a tray having solid state disks from one end near the tray feeding mechanism 300 to the other end near the tray unloading mechanism 1000. The first delivery device 610 and the second delivery device 620 respectively transport solid state disks having different specifications. For example, the first delivery device 610 conveys M2 solid state disks, and the second delivery device 620 conveys 2.5 solid state disks. In this embodiment, the electrostatic bag package production line for solid state disks packages a 2.5 solid state disk inside an electrostatic bag and transports the 2.5 solid state disk via the second delivery device 620. The M2 solid state disk transported via the first delivery device 610 is scanned and discharged.

Preferably, the 2.5 solid state disk is transferred to the second delivery device 620, and then passes through the package mechanism 700 and is packaged inside an electrostatic bag. Subsequently, the 2.5 solid state disk passes through the sealing mechanism 800 and is sealed.

As shown in FIGS. 2-4, the electrostatic bag package production line also includes a feeding device for an electrostatic bag 1700. The feeding device for an electrostatic bag 1700 is disposed on the side of the package mechanism 700 facing away from the second delivery device 620. The feeding device for an electrostatic bag 1700 is used for supplying electrostatic bags to the package mechanism 700 so as to package the solid state disk inside an electrostatic bag. As shown in FIG. 5, the number of the feeding devices for an electrostatic bag 1700 is two, and the two feeding devices for an electrostatic bag 1700 directly face the package mechanism 700. Specifically, the two feeding devices for an electrostatic bag 1700 directly face the electrostatic bag package position of the package mechanism 700. The carrying mechanism 1710 is disposed on a side of the feeding device 1700 for an electrostatic bag away from the package mechanism 700, and the reel P with electrostatic bags S can be conveniently loaded onto the carrying mechanisms 1710a and 1710b. It can be understood that each electrostatic bag S is in the shape of a long tube and open at both ends. Concretely, the electrostatic bags S are pressed into a flat structure to form a long band and are wound around the reel. The front end of the electrostatic bag has an opening and extends toward the package mechanism 700. With the package mechanism 700 pulling, the reel at the carrying mechanism 1710a or 1710b rotates, the electrostatic bag gradually moves to the package mechanism 700, and is packaged around the outside of the solid state disk and cut to a certain length.

As shown in FIGS. 5-8, each feeding device for an electrostatic bag 1700 includes two (upper and lower) carrying mechanisms 1710a and 1710b arranged up and down, and a feeding position 1700c of the feeding device 1700 is disposed between the two carrying mechanisms 1710a and 1710b and faces the package mechanism 700. The two carrying mechanisms 1710a and 1710b are respectively used for carrying one reel P, which is wound with electrostatic bags. Furthermore, the two carrying mechanisms 1710a and 1710b can be moved up and down to switch positions. Therefore, when the electrostatic bags of the upper carrying mechanism 1710a at the upper electrostatic bag supply position 1700a are used up, the two carrying mechanisms 1710a and 1710b can move up and down and switch positions. Thereby, the lower carrying mechanism 1710b is positioned at the electrostatic bag supply position 1700a at the upper side to supply electrostatic bags S to the package mechanism 700 via a new reel P. Therefore, the feeding device for an electrostatic bag can supply electrostatic bags to a package mechanism 700, reload the electrostatic bag without stopping the machine, and ensure the continuous operation of the package mechanism 700.

It can be understood that, although the two carrying mechanisms 1710 located on the upper and lower sides can both supply the electrostatic bags to the package mechanism 700, the electrostatic bags on the upper carrying mechanism 1710a located on the upper side can be pulled out to feed more conveniently. But it is not convenient for the operator to load and unload the reel from the lower carrying mechanism 1710b at the same time. In actual use, the position on the upper side is preferably regarded as the electrostatic bag supply position 1700a, and the position on the lower side is preferably regarded as an electrostatic bag preparation position 1700b.

During use, before the electrostatic bags of the upper carrying mechanism 1710a on the electrostatic bag supply position 1700a are used up, the end opening of the electrostatic bags at the current reel P is connected to the front end opening of the electrostatic bags on the lower carrying mechanism 1710b on the electrostatic bag preparation position 1700b. Thus, the end of the electrostatic bags on the previous reel P is connected with the starting end of the electrostatic bags on the following reel P, which is a continuous structure, so the electrostatic bags are continuously sent to the package mechanism 700 to continuously operate the package mechanism 700. At this point, the empty reel can be removed and the new reel is reloaded at the lower carrying mechanism 1710b.

Since the carrying mechanisms 1710a and 1710b can alternately move up and down, when the electrostatic bags on the upper carrying mechanism 1710a are used up, the end opening of the electrostatic bags is connected with the front end opening of the electrostatic bags on the lower carrying mechanism 1710b. After the front opening of the electrostatic bag is connected, the positioning mechanism on the lower side can move upward to the electrostatic bag supply position 1700a, and the original positioning mechanism on the upper side moves downward to the electrostatic bag preparation position 1700b.

Figure 6:
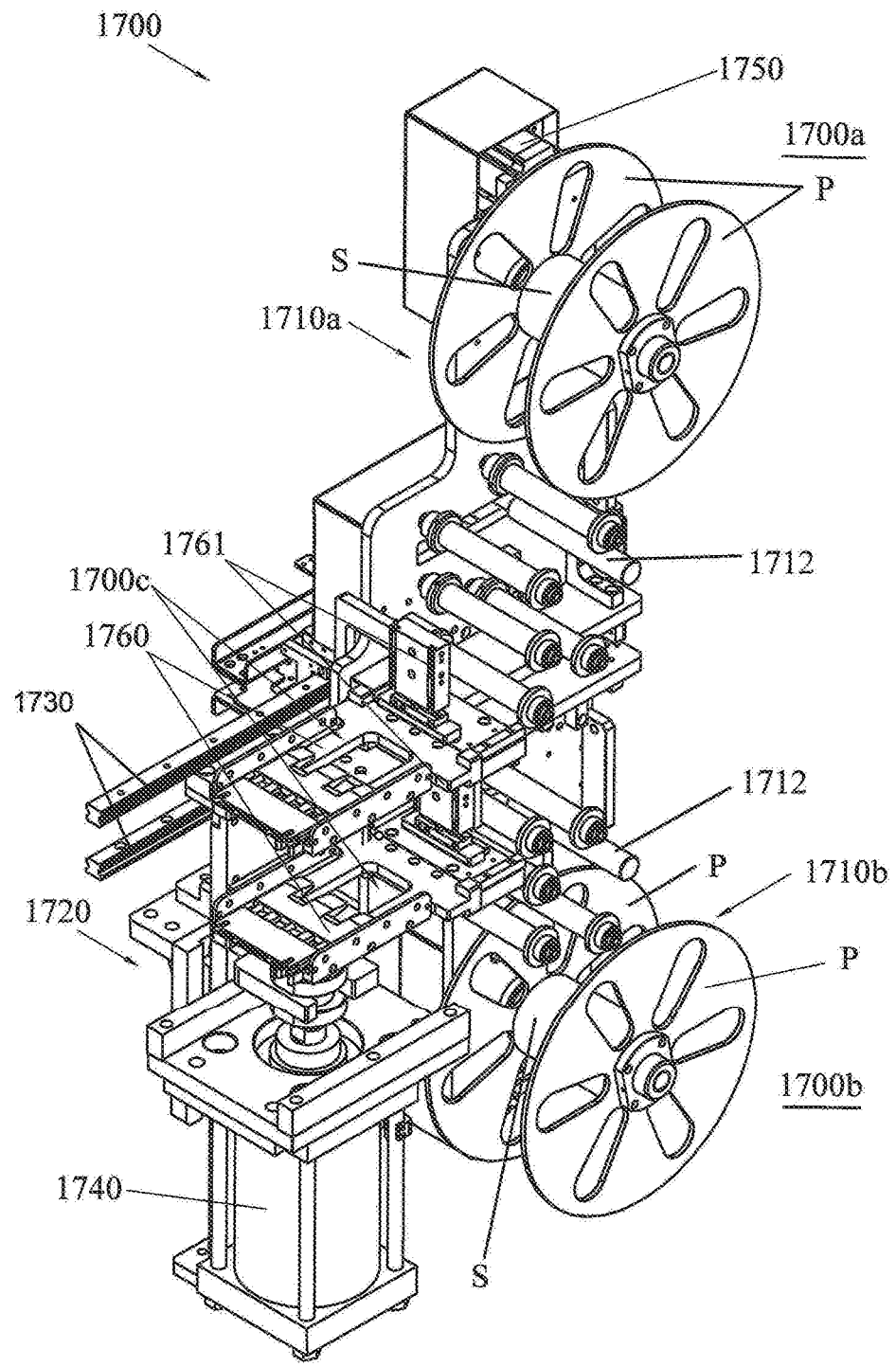
FIG. 6 is a perspective view of a single feeding device for an electrostatic bag according to the present invention.

Preferably, as shown in FIG. 6, in order to switch the two carrying mechanisms 1710a and 1710b, a position switching mechanism 1720 is disposed between the two carrying mechanisms 1710a and 1710b. When one of the carrying mechanism 1710a and 1710b is urged to move towards the other one, the other carrying mechanism 1710a or 1710b moves correspondingly under the action of the position switching mechanism 1720 to switch the two carrying mechanisms 1710a and 1710b. More specifically, the position switching mechanism 1720 may be a gear rack or other mechanisms that can realize the vertical staggered movement of the two carrying mechanisms 1710.

Figure 7:
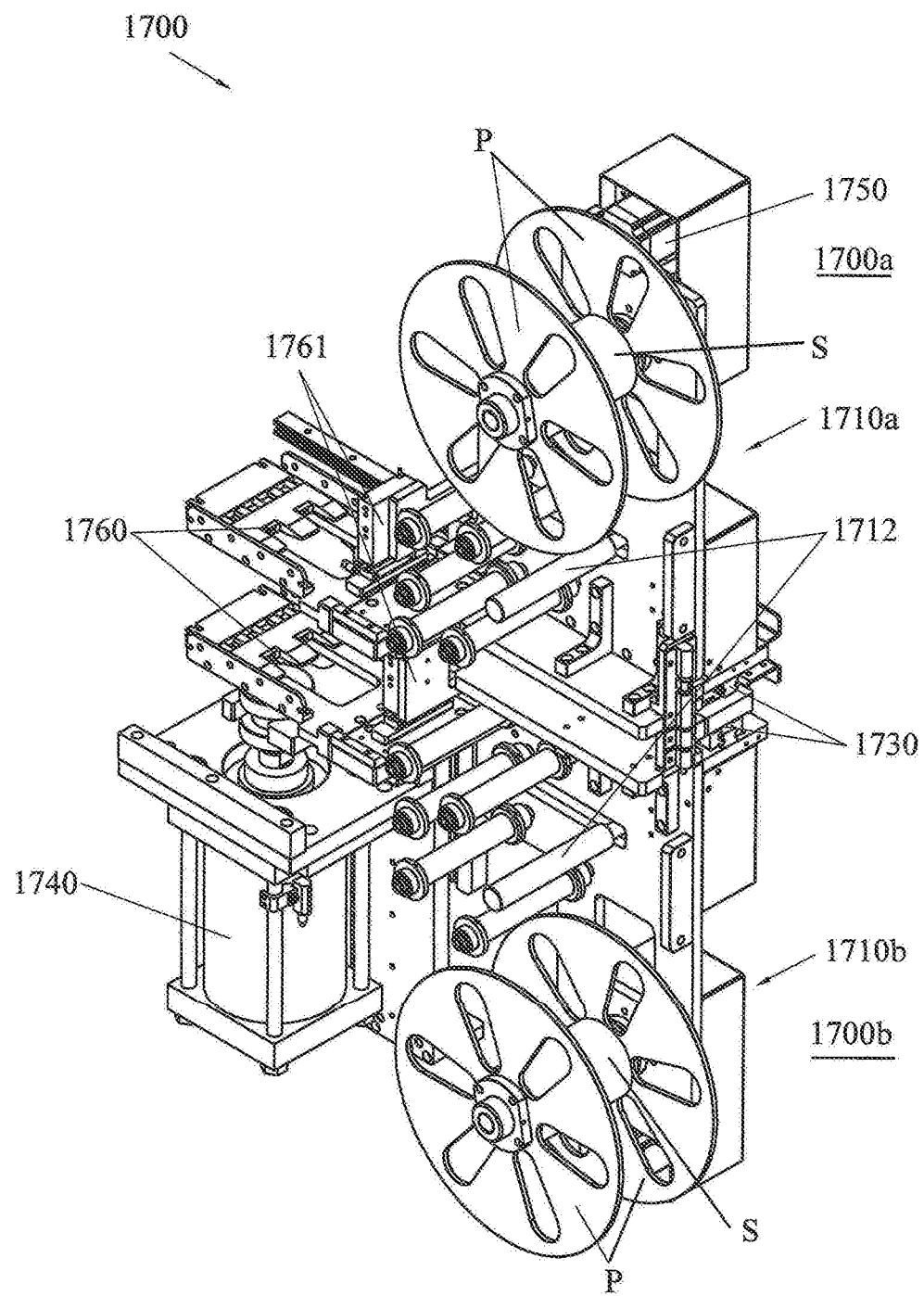
FIG. 7 is a perspective view of the feeding device for an electrostatic bag of FIG. 6 from another angle according to the present invention.

Referring to FIG. 6 and FIG. 7, the feeding device for an electrostatic bag 1700 further includes a switching drive mechanism 1740 for driving one of the two carrying mechanisms 1710a and 1710b to move vertically. It can be understood that the switching drive mechanism 1740 drives only one of the two carrying mechanisms 1710a and 1710b. When one of the carrying mechanisms 1710a or 1710b is located at the electrostatic bag preparation position 1700b at the lower side, so-called the lower carrying mechanism 1710b required to be switched, the switching drive mechanism 1740 drives the current lower carrying mechanism 1710b to move up to the electrostatic bag supply position 1700a, thereby supplying the electrostatic bags to the package mechanism 700, now the original lower carrying mechanism 1710b is switched to be a new upper carrying mechanism 1710a at the position 1700a. When the electrostatic bags of the new upper carrying mechanism 1710a located on the electrostatic bag supplying position 1700a at the upper side are used up and it needs to switch position again, the switching drive mechanism 1740 drives the new upper carrying mechanism 1710a to move down to the electrostatic bag preparation position 1700b to remove the empty reel P and reload a new reel P with the electrostatic bags. In the process, the carrying mechanism 1710b is driven by the switching drive mechanism 1740, and the other carrying mechanism 1710a is moved to the target position by the position switching mechanism 1720.

It can be understood that the two carrying mechanisms 1710a and 1710b are arranged up and down to prevent the two carrying mechanisms 1710a and 1710b from interfering with each other. The feeding device for an electrostatic bag 1700 also includes a driving mechanism 1730 for driving at least one of the two carrying mechanisms 1710a and 1710b to move in a horizontal direction. Specifically, in this embodiment, the driving mechanism 1730 drives the upper carrying mechanism 1710a on the upper side away from the feeding position 1700c, so that projections of the two supporting mechanisms 1710a and 1710b in the horizontal plane are staggered.

Figure 8:
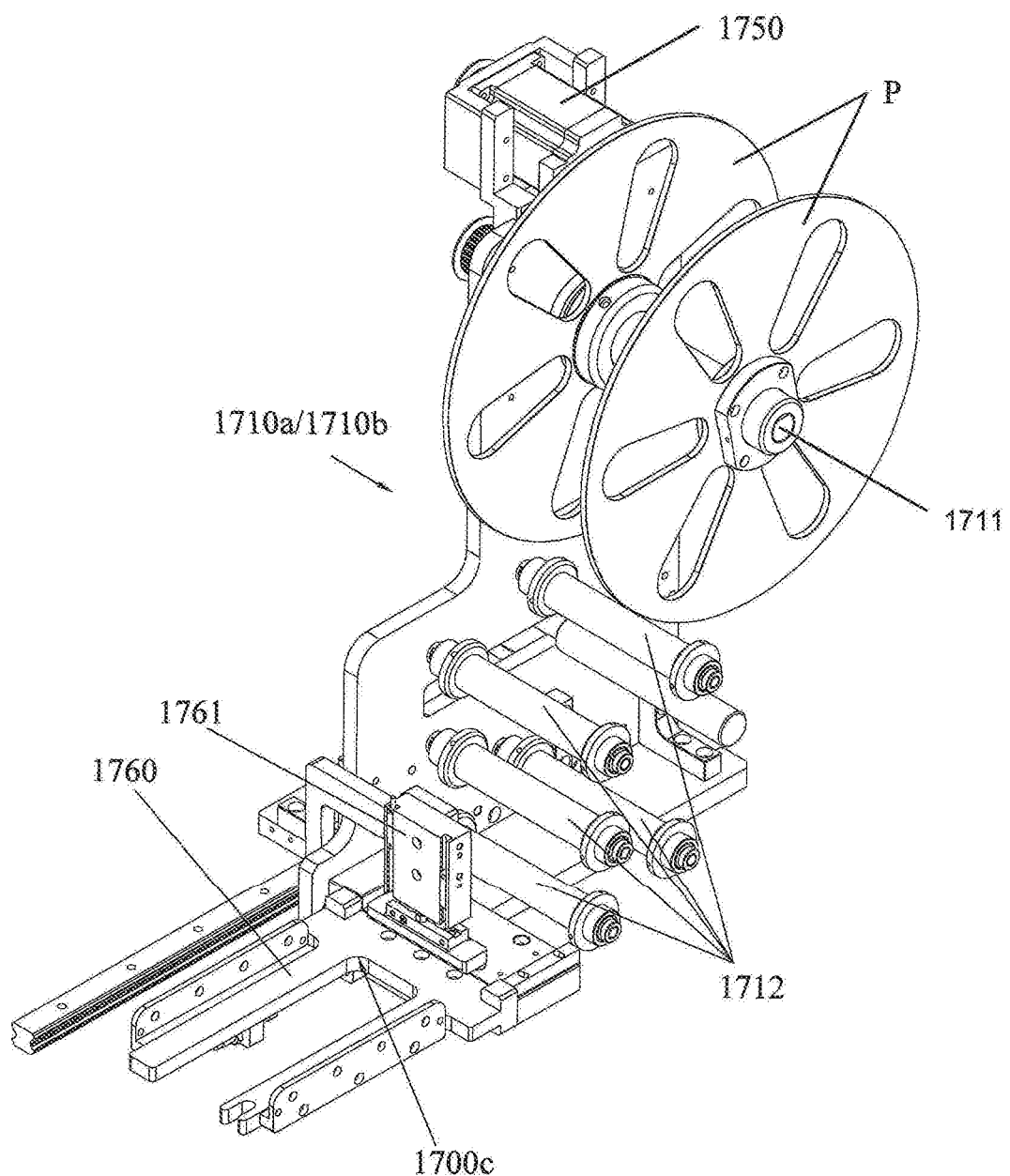
FIG. 8 is a perspective view of a single carrying mechanism according to the present invention.

Referring to FIG. 8, each carrying mechanism 1710a or 1710b includes a positioning rod 1711 for positioning the reel, and at least one tension rod 1712 disposed between the positioning rod 1711 and the package mechanism 700. The tension rod 1712 can stop pulling the electrostatic bag, so that the electrostatic bag maintains an average degree of tightness to avoid deformation of the electrostatic bag due to excessive local force. The carrying mechanism 1710a or 1710b also includes a drive member 1750 for driving the positioning rod 1711 to rotate the reel P.

Referring to FIGS. 5-7, the feeding device for an electrostatic bag 1700 includes a feeding bracket 1760. The feeding bracket 1760 is disposed at the feeding position 1700c of the two carrying mechanisms 1710, for transporting the electrostatic bag to the package mechanism. Specifically, the feeding bracket 1760 is further provided with a clamping mechanism 1761 for clamping and positioning the electrostatic bag.

Referring to FIGS. 2-4, under the action of the package mechanism 700, the electrostatic bag, which is fed to the package mechanism 700, is placed outside the corresponding solid state disk, and is individually cut to a size corresponding to the solid state disk. Subsequently, the solid state disk with the electrostatic bag moves along the second delivery device 620 to the sealing mechanism 800 for sealing electrostatic bag; and the sealing mechanism 800 heat-seals the solid state disks. The solid state disk packaged with the electrostatic bag is then unloaded via the solid state disk unloading mechanism 900 and the tray unloading mechanism 1000.

As shown in FIGS. 1-8, the working process of the feeding device for an electrostatic bag 1700 according to this embodiment is described in detail:

The operator places one reel P with the electrostatic bags to the carrying mechanism 1710b at the electrostatic bag preparation position 1700b, and is reliably positioned by the positioning rod 1711; the front end of the electrostatic bag passes through several tension rods 1712 and reaches the feeding position 1700c.

The switching drive mechanism 1740 drives the current lower carrying mechanism 1710b to move upward to the electrostatic bag supply position 1700a; meanwhile, the position switching mechanism 1720 drives the other (namely the current upper) carrying mechanism 1710a located at the electrostatic bag supply position 1700a to move down to the electrostatic bag preparation position 1700b.

The package mechanism 700 starts and drags the front end of the electrostatic bags; at the same time, the driving mechanism 1730 drives the positioning rod 1711 to rotate, thereby loading the electrostatic bags; the operator then loads the reel P with the electrostatic bags to the current lower carrying mechanism 1710b at the electrostatic bag preparation position 1700b.

Before the electrostatic bags of the current upper carrying mechanism 1710a on the electrostatic bag supply position 1700a are used up, the end opening of the electrostatic bags is connected to the front end opening of the electrostatic bags on another carrying mechanism 1710b on an electrostatic bag preparation position 1700b; thus, the end of the electrostatic bags on the previous reel P is connected with the starting end of the electrostatic bags on the following reel P, which is a continuous structure, so the electrostatic bags are continuously sent to the package mechanism 700 to continuously operate the package mechanism 700.

Then, the switching drive mechanism 1740 switches the positions of the two carrying mechanisms 1710*a* and 1710*b*; and the above operation is repeated.

In comparison with the prior art, the feeding device for an electrostatic bag 1700 can supply the electrostatic bag to the package mechanism 700 so as to package the solid state disk inside an electrostatic bag. Two carrying mechanisms 1710*a* and 1710*b* arranged up and down on the feeding device for an electrostatic bag 1700 can move up and down to switch positions. When the electrostatic bags of the upper carrying mechanism 1710*a* at the upper electrostatic bag supply position 1700*a* are used up, the two carrying mechanisms 1710*a* and 1710*b* move up and down and switch positions. So that another carrying mechanism 1710*b* can be positioned at the upper electrostatic bag supply position 1700*a*, and the electrostatic bag is supplied to the package mechanism 700 via a new reel. Therefore, the feeding device for an electrostatic bag 1700 can supply electrostatic bags to a package mechanism 700, reload the electrostatic bag without stopping the machine, and ensure the continuous operation of the package mechanism 700.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A feeding device for an electrostatic bag, adapted for supplying electrostatic bags to a package mechanism so as to wrap a solid state disk (SSD) with an electrostatic bag, wherein the feeding device for an electrostatic bag comprises two carrying mechanisms arranged up and down, each of the two carrying mechanisms supports at least one reel that is wound with multiple electrostatic bags, a feeding position is disposed between the two carrying mechanisms and faces the package mechanism, and the two carrying mechanisms are movable up and down to switch positions with one another, each carrying mechanism, comprises a positioning rod, for positioning the at least one reel, and a tension rod disposed between the positioning rod and the package mechanism, and the feeding device further comprises a feeding bracket disposed on the feeding position, for transporting the electrostatic bag to the package mechanism, and the feeding bracket is provided with a clamping mechanism, for clamping and positioning the electrostatic bag.

2. The feeding device for an electrostatic bag according to claim 1, wherein a position switching mechanism is disposed between the two carrying mechanisms, and when one of the carrying mechanisms is moved towards the other carrying mechanism, the other carrying mechanism is correspondingly moved under an action of the position switching mechanism to switch positions with one another.

3. The feeding device for an electrostatic bag according to claim 2, wherein the position switching mechanism includes gear racks.

4. The feeding device for an electrostatic bag according to claim 2, further comprising a switching drive mechanism, for driving the two carrying mechanisms to move vertically.

5. The feeding device for an electrostatic bag according to claim 1, wherein the feeding device for an electrostatic bag further comprises a driving mechanism for driving at least one of the carrying mechanisms to move in a horizontal direction, so that when the two carrying mechanisms move up and down to switch positions, the two carrying mechanisms avoid collision.

6. The feeding device for an electrostatic bag according to claim 5, wherein the driving mechanism is configured to drive one of the carrying mechanisms located on an upper side to move in a horizontal direction, so that projections of the two carrying mechanisms in a horizontal plane are staggered.

\* \* \* \* \*